United States Patent [19]

Matthews

[11] Patent Number: 4,996,450

[45] Date of Patent: Feb. 26, 1991

[54] DATA PROCESSOR CIRCUIT AND METHOD FOR CONTROLLING VOLTAGE VARIATION OF A DYNAMIC NODE

[75] Inventor: Lloyd P. Matthews, Buda, Tex.

[73] Assignee: Motorola, Inc., Schaumburg, Ill.

[21] Appl. No.: 486,443

[22] Filed: Feb. 28, 1990

[51] Int. Cl.[5] .................. H03K 3/013; H03K 3/353; H03K 17/10; H03K 19/046

[52] U.S. Cl. .................................... 307/449; 307/463; 307/270; 307/481; 307/452; 307/482; 365/203

[58] Field of Search .............. 307/449, 463, 270, 450, 307/451, 452, 453, 481, 530, 304, 576, 579, 585, 443, 475, 269, 482; 328/172, 173, 176; 365/203

[56] References Cited

U.S. PATENT DOCUMENTS

| | | | |
|---|---|---|---|
| 4,628,218 | 12/1986 | Nakaizumi | 307/585 X |
| 4,636,657 | 1/1987 | Reddy | 307/269 |
| 4,649,289 | 3/1987 | Nakano | 307/270 X |
| 4,649,291 | 3/1987 | Konishi | 307/270 X |
| 4,897,565 | 1/1990 | Shimizu | 307/448 |
| 4,920,287 | 4/1990 | Hartgring et al. | 307/585 X |
| 4,954,730 | 9/1990 | Yoh | 307/443 X |

Primary Examiner—Stanley D. Miller
Assistant Examiner—David R. Bertelson
Attorney, Agent, or Firm—Robert L. King

[57] ABSTRACT

In a data processing system having an ALU and a memory, a decode/driver circuit has a dynamic node in which the voltage variation of the node is controlled. When the circuit is enabled, the dynamic node is precharged to a predetermined voltage potential which drives an output drive transistor. The output drive transistor couples a decoded select signal to an output terminal and inadvertently causes the dynamic node's voltage potential to change, thereby negatively affecting the voltage at the output terminal. To compensate, a transistor is provided which connects a predetermined voltage terminal to the dynamic node in response to the voltage at the output terminal.

8 Claims, 2 Drawing Sheets

DATA PROCESSOR CIRCUIT AND METHOD FOR CONTROLLING VOLTAGE VARIATION OF A DYNAMIC NODE

TECHNICAL FIELD

This invention relates to data processors, and more particularly, to data processors having memories with decoder/driver circuits.

BACKGROUND OF THE INVENTION

Single chip data processors often comprise an arithmetic logic unit (ALU) which is coupled via a data bus to a memory. The memory is typically an array memory having both a column decoder and a row decoder. The column and row decoders function generally by decoding one or more input signals and driving an output signal to the memory array which is primarily a capacitive load. Within most decoder/driver circuits is a dynamic node which is the output of a decode portion and biases a driver output stage. Due to undesired capacitive coupling between the dynamic node and the driver output stage, the voltage potential of the dynamic node is degraded and reduced in value. As a result of the reduced voltage which biases the driver output stage, the output voltage of the driver does not immediately transition resulting in slow data access times within the memory. Because of processing and layout variations, the data access times within the memory may also vary significantly. Others have compensated for the stated circuit condition by using a charge pump to selectively boost the voltage at the dynamic node when needed. An example of such a circuit is taught by Harvey Stiegler in U.S. Pat. No. 4,692,638. The known techniques which compensate for parasitic capacitances causing slow data access times have involved the addition of a significant amount of circuitry and layout considerations.

SUMMARY OF THE INVENTION

Accordingly, it is an object of the present invention to provide an improved circuit and method for controlling voltage variation of a dynamic node.

Another object of the present invention is to provide an improved data processing system having a memory with a decoder circuit.

In carrying out the above and other objects of the present invention, there is provided, in one form, a data processing system having an arithmetic unit for performing predetermined arithmetic operations. A memory communicates operands with the arithmetic unit via a communications bus. Within the memory of the data processing system is a circuit and method for controlling the voltage variation of a dynamic node. A first transistor has a first current electrode coupled to a first voltage terminal. A second current electrode of the first transistor is coupled to the dynamic node, and a control electrode of the first transistor receives a first control signal. A second transistor has a first current electrode coupled to the second current electrode of the first transistor at the dynamic node. A control electrode of the second transistor receives a second control signal, and a second current electrode of the second transistor is coupled to a second voltage terminal. A third transistor has a first current electrode for receiving a third control signal, a control electrode coupled to the second current electrode of the first transistor at the dynamic node, and a second current electrode coupled to an output terminal for providing an output drive signal. A fourth transistor has a first current electrode coupled to the control electrode of the third transistor at the dynamic node. A control electrode of the fourth transistor is coupled to the output terminal, and a second current electrode is coupled to the second voltage terminal.

These and other objects, features, and advantages, will be more clearly understood from the following detailed description taken in conjunction with the accompanying drawings.

DETAILED DESCRIPTION OF THE INVENTION

Figure 1:
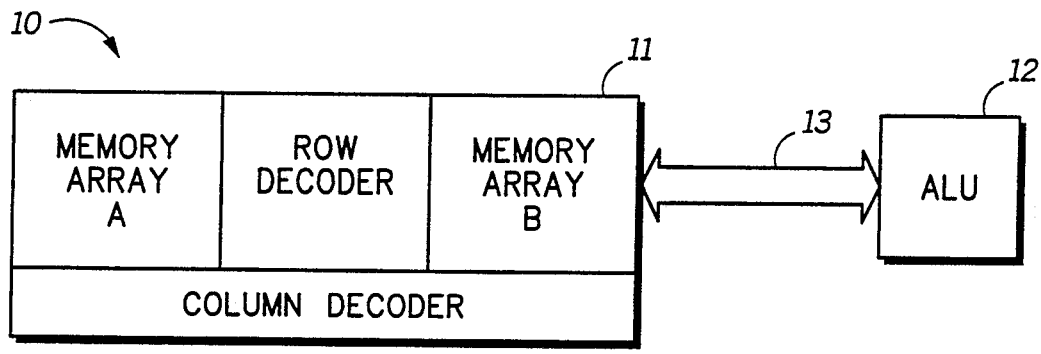
FIG. 1 illustrates in block diagram form a data processing system in which the present invention may be used.

Shown in FIG. 1 is a data processing system 10 generally comprising a memory 11, an ALU 12 and a communication bus 13. Functionally, ALU 12 performs a variety of arithmetic operations, and memory 11 stores and supplies data required to implement the numerous operations performed by ALU 12. Memory 11 may be implemented in many different forms and types. One common form of memory is as shown in FIG. 1 wherein memory 11 is formed of two arrays, A and B, separated by a row decoder. Memory arrays A and B are each formed of rows and columns of transistor cells. A column decoder is commonly placed at the bottom of the structure of memory 11. The row and column decoders receive signals from an address control unit (not shown) in response to a request for data operands from ALU 12. The row and column decoders each decode one or more received input signals and respectively select a predetermined row and column of transistor cells in the memory array. A circuit is typically utilized for both decoding and driving an output signal of sufficient voltage level to the memory array to address a predetermined operand location.

Figure 2:
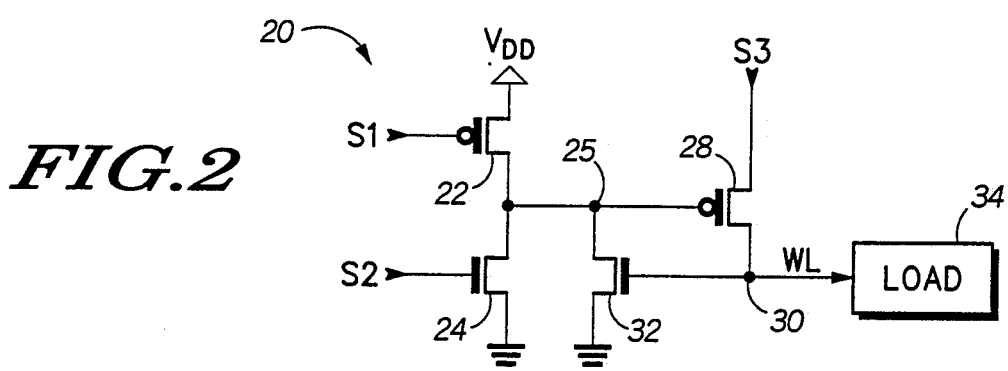
FIG. 2 illustrates in schematic form a data processing circuit in accordance with the present invention.

Shown in FIG. 2 is a decoder/driver circuit 20 in accordance with the present invention. A P-channel transistor 22 has a source connected to a positive power supply voltage terminal labeled "$V_{DD}$", a gate connected to a Select signal S1, and a drain connected to a drain of an N-channel transistor 24 at a dynamic node 25. A gate of transistor 24 is connected to a Precharge signal S2, and a source of transistor 24 is connected to a ground terminal. A Select signal S3 is connected to a source of a P-channel transistor 28. Transistor 28 has a gate connected to dynamic node 25 and a drain connected to an output terminal at a node 30 which provides a Word Line (WL) output. An N-channel transistor 32 has a drain connected to dynamic node 25, a gate connected to node 30, and a source connected to a ground terminal. A load 34 is connected to decoder/driver circuit 20 at node 30.

Figure 3:
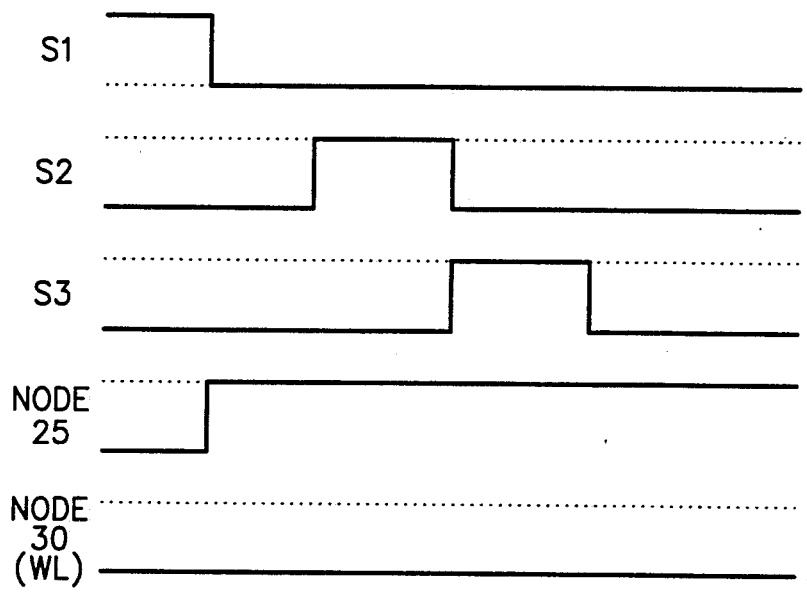
FIG. 3 illustrates in graphical form control and circuit signals associated with the circuit of FIG. 2 in a first mode of operation.

In operation, decoder/driver circuit 20 functions in one of two modes wherein circuit 20 is either selected or not selected to provide a data word line drive signal to load 34. In one form, load 34 may represent either a row or a column of transistors in either memory array A or B of data processing system 10 of FIG. 1. Referring to FIG. 3, signals associated with circuit 20 when in a first or non-selected mode of operation are illustrated. Signals S1, S2 and S3 are decoded clock drive signals which are connected to circuit 20 from previous decode stages of decode circuitry not shown. In the non-selected mode, Select signal S1 transitions to a logic low value and remains low during the non-selected mode. Node 25 is a dynamic node meaning that node 25 transitions between logic levels in direct response to the values of signals S1, S2 and S3. In the non-selected mode, transistor 22 is conductive which makes dynamic node 25 have a logic high value. Precharge signal S2 transitions to a logic high level for a predetermined amount of time making both of transistors 22 and 24 conductive. Dynamic node 25 completes precharging during this time. After a predetermined time, Precharge signal S2 transitions to a logic low and Select signal S3 transitions to a logic high for a predetermined amount of time. However, because dynamic node 25 remains at a logic high, transistor 28 remains nonconductive and Select signal S3 is not coupled to node 30 which is at a logic low. Since the word line (WL) signal remains at a logic low, circuit 20 is in a nonselected mode.

Figure 4:
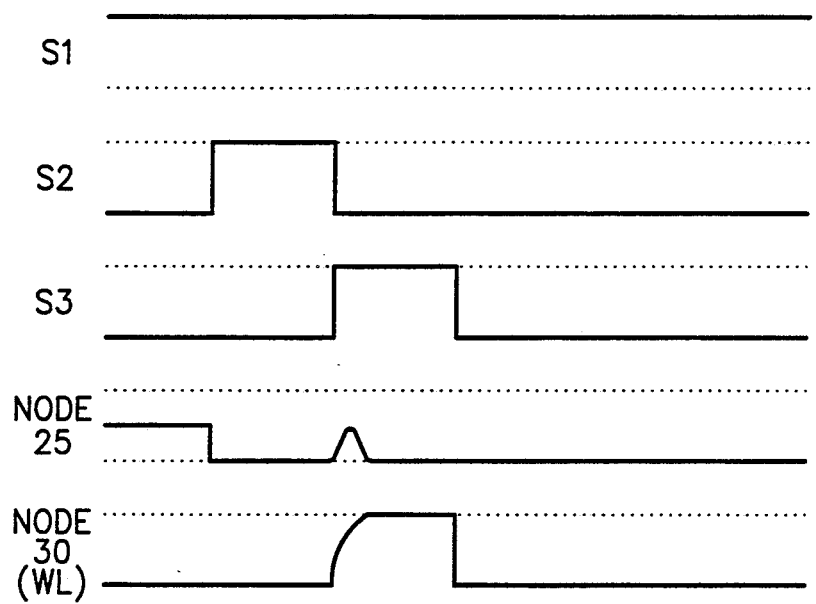
FIG. 4 illustrates in graphical form control and circuit signals associated with the circuit of FIG. 2 in a second mode of operation.

Shown in FIG. 4 are signals associated with a second or selected mode of operation. In the selected mode, Select signal S1 is at a logic high and remains at a logic high throughout this mode. Therefore, transistor 22 remains nonconductive. Assume initially that dynamic node 25 is charged to some voltage level intermediate between the supply voltage $V_{DD}$ and ground, and the output at node 30 is at a logic low. Node 30 may be preliminarily clamped to a logic low by a transistor (not shown) controlled by a control signal, such as precharge signal S2. It should be well understood that the selective clamping of node 30 to a predetermined logic value is not relevant to the present invention. A Precharge signal S2 transitions to a logic high thereby making transistor 24 conductive. Dynamic node 25 immediately drops in voltage potential to the ground potential which makes transistor 28 conductive. However, since Select signal S3 is at a logic low, the output at node 30 remains at a logic low and transistor 32 remains nonconductive. After a predetermined time, Precharge signal S2 transitions back to a logic low and Select signal S3 transitions to a logic high. The logic high of Select signal S3 is coupled to the output at node 30 via transistor 28. Because load 34 is primarily a capacitive load, node 30 does not immediately transition to a logic high.

In the illustrated form, transistor 32 performs a function which noticeably improves the data access time of circuit 20. Associated with dynamic node 25 is an undesired parasitic capacitance originating from several sources. A parasitic capacitance exists between each of dynamic node 25 and the source of transistor 28, the drain of transistor 28, the gate and drain of transistor 32, the gate and drain of transistor 24, the gate and drain of transistor 22 as well as other parasitic capacitances related to the circuit layout which are coupled to dynamic node 25. As a result of capacitive coupling, when output terminal 30 rises to a voltage potential of approximately $V_{DD}$, dynamic node 25 tends to rise in voltage potential to a value related to the proportionality of the sum of the parasitic capacitances associated with transistor 28 and the sum of all other parasitic capacitances which are coupled to dynamic node 25. The net effect of the increase in voltage potential of dynamic node 25 is that transistor 28 is quickly biased less conductive resulting in output terminal 30 have significantly reduced drive capability. However, as a result of the operation of transistor 32, when node 30 rises to a logic high (i.e. $V_{DD}$), transistor 32 becomes conductive and clamps dynamic node 25 back to a logic low (i.e. ground). Transistor 32 functions to ensure that dynamic node 25 is not allowed to remain at a voltage level substantially above ground potential as shown in FIG. 4. When the Select signal S3 is at a logic high, node 30 is also at a logic high for substantially the same length of time. Due to coupling capacitance between the drain/gate and gate/source of transistor 28, a slight delay at node 30 is noticeable after Select signal S3 transitions. As noted in FIG. 4, node 25 is permitted to rise in voltage potential only a very small portion of the overall time period when Select signal S3 and node 30 are at logic highs. As a result, the data access time of a memory which utilizes circuit 20 is noticeably improved.

Figure 5:
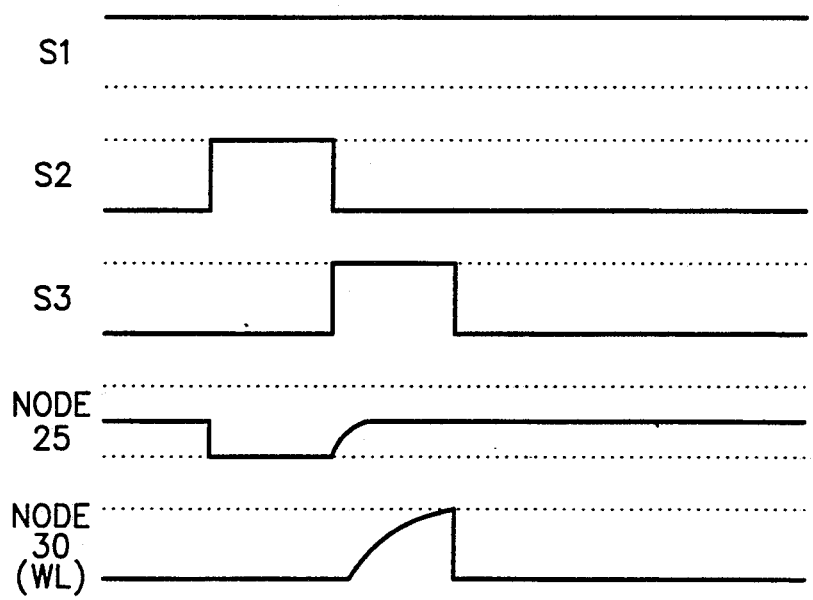
FIG. 5 illustrates in graphical form control and circuit signals of FIG. 2 without the full features of FIG. 2.

Shown in FIG. 5 is a graphical illustration of the operation of circuit 20 without the presence of transistor 32. For the purpose of comparison, the signals S1, S2 and S3 are the same as in FIG. 4. It should be noted that without transistor 32, as node 30 rises in response to Select signal S3, so does dynamic node 25. The intermediate logic level of voltage at the gate of transistor 28 biases transistor 28 so that the drive voltage at node 30 is significantly reduced and may not reach a full logic high until Select signal S3 transitions low again. The load 34 is highly capacitive in nature which also tends to slow the rise time of the voltage at node 30. The net result in FIG. 5 of the slowly rising voltage at node 30 which functions as a word line is a slow memory data access time of memory 11 in data processing system 10. Another potential problem is associated with the fact that the rise time of node 30 in FIG. 5 is subject to variation depending upon process and circuit variations. For example, other decoding P-channel transistors (not shown) such as transistor 22 may be connected to dynamic node 25. In the illustrated form, transistors 22 and 24 only represent the final stage of decoding which is connected to transistor 28 which functions as a word line driver. Other transistors which might be connected to dynamic node 25 add further parasitic capacitance which only further slows the logic transition of node 30, the word line.

By now it should be apparent that with the use of a single transistor, transistor 32, the drive capability and response time of a decoder/driver circuit is improved. Transistor 32 utilizes the output drive voltage as feedback to selectively control the clamping of dynamic node 25 to a predetermined voltage level. Although specific N-channel and P-channel MOS transistors are discussed, it should be well understood that the present invention may be implemented with other types of transistors and transistors having other conductivities. The present invention improves the operating performance of a decoder/driver with minimal additional circuitry.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. In a data processing system comprising an arithmetic unit for performing predetermined arithmetic operations, a memory for communicating operands with the arithmetic unit via a coupled communications bus, a circuit within the memory for controlling the voltage variation of a dynamic node, comprising:
   a first transistor having a first current electrode coupled to a first voltage terminal, a control electrode for receiving a first control signal, and a second current electrode coupled to the dynamic node;
   a second transistor having a first current electrode coupled to the second current electrode of the first transistor at the dynamic node, a control electrode for receiving a second control signal, and a second current electrode coupled to a second voltage terminal;
   a third transistor having a first current electrode for receiving a third control signal, a control electrode coupled to the second current electrode of the first transistor at the dynamic node, and a second current electrode coupled to an output terminal for providing an output drive signal; and
   a fourth transistor having a first current electrode coupled to the control electrode of the third transistor at the dynamic node, a control electrode coupled to the output terminal, and a second current electrode coupled to the second voltage terminal.

2. The data processing system of claim 1 wherein the first control signal is an enable signal for enabling the circuit's dynamic node to vary in voltage potential, the second control signal is a precharge signal for charging the dynamic node to a predetermined voltage, and the third control signal is a decode control signal of the memory which is coupled to the output terminal.

3. The data processing system of claim 1 wherein the first and third transistors are of a first conductivity type, and the second and fourth transistors are of a second conductivity type.

4. The data processing system of claim 3 wherein the first and third transistors are P-channel MOS transistors, and the second and fourth transistors are N-channel MOS transistors.

5. In a data processing system having an arithmetic unit for performing predetermined arithmetic operations, a memory for communicating operands with the arithmetic unit via a communications bus, and a decoder/driver circuit within the memory for accessing operand storage locations within the memory, a method for controlling voltage variation of a dynamic node within the decode/driver circuit, comprising the steps of:
   precharging the dynamic node by coupling a first transistor to the dynamic node for selectively charging the dynamic node to a predetermined voltage;
   biasing a second transistor with the predetermined voltage at the dynamic node to provide an output drive signal; and
   preventing the dynamic node from substantially varying from the predetermined voltage in direct response to the output drive signal.

6. The method in the data processing system of claim 5 wherein the dynamic node is prevented from substantially varying from the predetermined voltage by the step of:
   using the output drive signal to bias a third transistor which couples the dynamic node to the predetermined voltage in response to the output drive signal.

7. A decode/driver circuit which controls voltage variation of a dynamically varying node therein, comprising:
   a first P-channel transistor having a source coupled to a first power supply terminal, a gate for receiving a first control signal, and a drain coupled to the dynamically varying node;
   a first N-channel transistor having a drain coupled to the drain of the first P-channel transistor, a gate for receiving a second control signal, and a source coupled to a second power supply terminal;
   a second P-channel transistor having a source coupled to a third control signal, a gate coupled to the dynamically varying node, and a drain coupled to an output terminal; and
   a second N-channel transistor having a drain coupled to the dynamically varying node, a gate coupled to the output terminal, and a source coupled to the second power supply terminal.

8. The decode/driver circuit of claim 7 wherein said first control signal is an enable signal for allowing the circuit's dynamically varying node to vary in voltage potential, the second control signal is a precharge signal for charging the dynamically varying node to a predetermined voltage, and the third control signal is a decode control signal of the memory which is coupled to the output terminal

* * * * *

REEXAMINATION CERTIFICATE (1826th)
United States Patent [19]
Matthews

[11] B1 4,996,450

[45] Certificate Issued Oct. 27, 1992

[54] DATA PROCESSOR AND METHOD FOR CONTROLLING VOLTAGE VARIATION OF A DYNAMIC NODE

[75] Inventor: Lloyd P. Matthews, Buda, Tex.

[73] Assignee: Motorola, Inc.

Reexamination Request:
No. 90/002,552, Feb. 18, 1992

Reexamination Certificate for:
Patent No.: 4,996,450
Issued: Feb. 26, 1991
Appl. No.: 486,443
Filed: Feb. 28, 1990

[51] Int. Cl.$^5$ .................. H03K 3/013; H03K 3/353; H03K 17/10; H03K 19/096
[52] U.S. Cl. ........................ 307/449; 307/270; 307/452; 307/463; 307/481; 307/482; 365/203
[58] Field of Search .............. 307/443, 449, 452, 463, 307/270, 279, 547, 548, 263

[56] References Cited
U.S. PATENT DOCUMENTS
4,086,500 4/1978 Suzuki et al. .............. 307/270

FOREIGN PATENT DOCUMENTS
1478321 5/1988 U.S.S.R. .............. 307/449

*Primary Examiner*—J. Zazworsky

[57] ABSTRACT

In a data processing system having an ALU and a memory, a decode/driver circuit has a dynamic node in which the voltage variation of the node is controlled. When the circuit is enabled, the dynamic node is precharged to a predetermined voltage potential which drives an drives an output drive transistor. The output drive transistor couples a decoded select signal to an output terminal and inadvertently causes the dynamic node's voltage potential to change, thereby negatively affecting the voltage at the output terminal. To compensate, a transistor is provided which connects a predetermined voltage terminal to the dynamic node in response to the voltage at the output terminal.

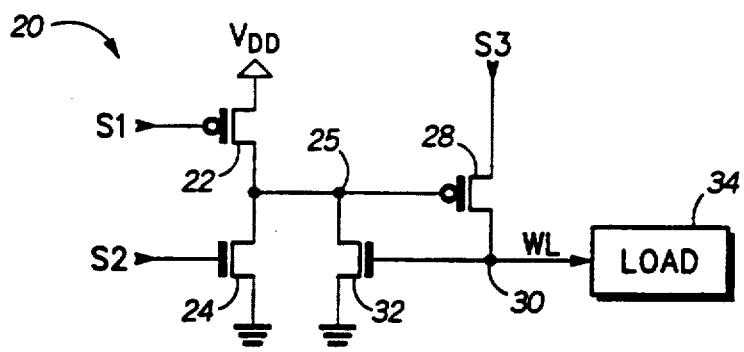

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 5-7 and 8 are determined to be patentable as amended.

Claims 3 and 4, dependent on an amended claim, are determined to be patentable.

1. In a data processing system comprising an arithmetic unit for performing predetermined arithmetic operations, a memory for communicating operands with the arithmetic unit via a coupled communications bus, a circuit within the memory for controlling the voltage variation of a dynamic node, comprising:
    a first transistor having a first current electrode [coupled] *connected* to a first *constant power supply* voltage terminal, a control electrode for receiving a first [control] *select* signal *which assumes a first logic value during an entire selected mode of operation during which the circuit is selected to provide an output drive signal*, and a second current electrode [coupled] *connected* to the dynamic node;
    a second transistor having a first current electrode [coupled] *connected* to the second current electrode of the first transistor at the dynamic node, a control electrode for receiving a [second control] *precharge* signal *which assumes the first logic value during a first predetermined time period of the selected mode of operation for selectively precharging the dynamic node to a second logic value*, and a second current electrode [coupled] *connected* to a second *constant power supply* voltage terminal;
    a third transistor having a first current electrode for receiving a [third control] *second select* signal *having the first logic value only for a second predetermined time period following the first predetermined time period*, a control electrode [coupled] *connected* to the second current electrode of the first transistor at the dynamic node, and a second current electrode [coupled] *connected* to an output terminal for providing [an] *the* output drive signal; and
    a fourth transistor having a first current electrode [coupled] *connected* to the control electrode of the third transistor at the dynamic node, a control electrode [coupled] *connected* to the output terminal, and a second current electrode [coupled] *connected* to the second voltage terminal.

2. The data processing system of claim 1 wherein the first [control] signal is an enable signal for enabling the circuit's dynamic node to vary in voltage potential, the [second control] *first logic value of the precharge* signal is a [precharge signal for charging the dynamic node to a predetermined voltage] *logic high value*, and the [third control] *second select* signal is a decode control signal of the memory [which is coupled to the output terminal].

5. In a data processing system having an arithmetic unit for performing predetermined arithmetic operations, a memory for communicating operands with the arithmetic unit via a communications bus, and a decoder/driver circuit within the memory for accessing operand storage locations within the memory, a method for controlling voltage variation of a dynamic node within the decode/driver circuit, comprising the steps of:
    precharging the dynamic node by [coupling] *connecting* a first transistor *and a second transistor* to the dynamic node for [selectively] charging the dynamic node to a predetermined voltage *in response to: (1) a first clock drive signal which assumes a first logic value during an entire selected mode of operation during which the decoder/driver circuit is selected to provide an output drive signal, the first clock drive signal controlling the first transistor which is connected between a first constant power supply voltage terminal and the dynamic node, and (2) a second clock drive signal biasing the second transistor which is connected between the dynamic node and a second constant power supply voltage terminal, the second clock drive signal assuming the first logic value during a first predetermined time period of the selected mode of operation;*
    biasing a [second] *third* transistor [with the predetermined voltage at] *by connecting a control electrode of the third transistor to* the dynamic node to [provide an] *connect a third clock drive signal to an output terminal as the* output drive signal, *the third clock drive signal assuming the first logic value during a second predetermined time period of the selected mode of operation following the first predetermined time period*; and
    preventing the dynamic node from substantially varying from the predetermined voltage in direct response to the output drive signal.

6. The method in the data processing system of claim 5 wherein the dynamic node is prevented from substantially varying from the predetermined voltage by the step of:
    using the output drive signal to bias a [third] *fourth* transistor which couples the dynamic node to the predetermined voltage in response to the output drive signal.

7. A decode/driver circuit *within a memory* which controls voltage variation of a dynamically varying node therein, comprising:
    a first P-channel transistor having a source [coupled] *connected* to a first *constant* power supply *voltage* terminal, a gate for receiving a first [control] *select* signal *which assumes a logic high value during an entire selected mode of operation during which the decode/driver circuit is selected to provide an output drive signal*, and a drain [coupled] *connected* to the dynamically varying node;
    a first N-channel transistor having a drain [coupled] *connected* to the drain of the first P-channel transistor, a gate for receiving a [second control] *precharge* signal *which assumes a logic high value during a first predetermined time period of the selected mode of operation to precharge the dynamic node to a logic*

*low value*, and a source [coupled] *connected* to a second *constant* power supply *voltage* terminal;

a second P-channel transistor having a source [coupled] *connected* to a [third control] *second select signal having the logic high value only for a second predetermined time period following the first predetermined time period*, a gate [coupled] *connected* to the dynamically varying node, and a drain [coupled] *connected* to an output terminal; and a second N-channel transistor having a drain [coupled] *connected* to the dynamically varying node, a gate [coupled] *connected* to the output terminal, and a source [coupled] *connected* to the second *constant* power supply terminal.

8. The decode/driver circuit of claim 7 wherein said first [control] *select* signal is an enable signal for allowing the circuit's dynamically varying node to vary in voltage potential, [the second control signal is a precharge signal for charging the dynamically varying node to a predetermined voltage,] and the [third control] *second select* signal is a decode control signal of the memory [which is coupled to the output terminal].

* * * * *